United States Patent
Maxim et al.

(10) Patent No.: US 7,643,600 B2
(45) Date of Patent: Jan. 5, 2010

(54) TECHNIQUES FOR PERFORMING GAIN AND PHASE CORRECTION IN A COMPLEX RADIO FREQUENCY RECEIVER

(75) Inventors: Adrian Maxim, Austin, TX (US); Charles D. Thompson, Buda, TX (US); Mitchell Reid, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 572 days.

(21) Appl. No.: 11/565,499

(22) Filed: Nov. 30, 2006

(65) Prior Publication Data

US 2008/0130800 A1 Jun. 5, 2008

(51) Int. Cl.
*H04L 25/40* (2006.01)
*H04L 7/00* (2006.01)
*H04L 25/00* (2006.01)

(52) U.S. Cl. ............... 375/371; 375/316; 375/324; 375/339; 375/340; 375/345

(58) Field of Classification Search ......... 375/371, 375/316, 324, 340, 339, 345
See application file for complete search history.

(56) References Cited

U.S. PATENT DOCUMENTS

| | | | |
|---|---|---|---|
| 6,778,117 B1 * | 8/2004 | Johnson | 341/144 |
| 7,358,885 B2 * | 4/2008 | Maxim et al. | 341/144 |
| 7,447,493 B2 * | 11/2008 | Johnson | 455/334 |
| 7,558,546 B2 * | 7/2009 | Johnson et al. | 455/182.3 |

* cited by examiner

*Primary Examiner*—Ted M Wang
(74) *Attorney, Agent, or Firm*—Polansky & Associates, P.L.L.C.

(57) ABSTRACT

A receiver (300) includes a first mixing digital-to-analog converter (DAC) (336, 332), a second mixing DAC (338, 334), a direct digital frequency synthesizer (DDFS) (302), a phase correction circuit (340), a selectable load (306) and a magnitude correction circuit (350). The first mixing DAC (336, 332) includes a first input for receiving an input signal, a second input for receiving a digital first local oscillator (LO) signal and an output. The second mixing DAC (338, 334) includes a first input for receiving the input signal, a second input for receiving a digital second local oscillator (LO) signal and an output. The DDFS (302) is configured to provide the first and second LO signals, which are quadrature signals. The phase correction circuit (340) is configured to provide a phase correction signal to a control input of the DDFS (302). The first selectable load (306) includes an input coupled to the output of the first mixing DAC (336, 332) and a control input. The magnitude correction circuit (350) is configured to provide a first magnitude correction signal to the control input of the first selectable load (306).

20 Claims, 7 Drawing Sheets

TECHNIQUES FOR PERFORMING GAIN AND PHASE CORRECTION IN A COMPLEX RADIO FREQUENCY RECEIVER

TECHNICAL FIELD

The present invention is generally directed to a radio frequency (RF) receiver and, more particularly, to gain and phase correction in a complex RE receiver.

BACKGROUND

As is known, broadcast TV uses a frequency spectrum of about 40 MHz to about 900 MHz, depending on the country and standard. In the usual case, the spectrum may be populated with both weak and strong channels, depending on a location of a given receiver with respect to a particular transmitter. In a typical case, a mixer of a receiver down-converts both a desired channel and an image channel. The image channel is situated on an opposite side of a local oscillator (LO) frequency at two times the intermediate frequency (IF) away from the desired channel. The image channel, when provided by a transmitter located near a receiver, may have a relatively high power, as compared to a power of a desired channel provided by a transmitter located at a greater distance from the receiver. Even when the down-conversion gain of the image channel is reduced through specific techniques (e.g., bandpass filtering around a desired channel), it can be difficult to achieve a desired attenuation of the image channel. As an image channel resides on top of a desired channel when down-converted, the image channel can significantly degrade the reception quality of a receiver.

A number of techniques have been utilized in receivers to address the image channel issue. For example, open-loop gain and phase correction (or calibration) has been used to address image channel issues for complex mixers of a receiver. However, when analog correction circuitry is implemented, the low accuracy of typical analog correction circuits tend to limit the image rejection performance of a receiver. Furthermore, an analog correction circuit typically requires calibration or recalibration to account for process, temperature, and/or supply voltage variations. In a quadrature mixer, finite image rejection may be attributable to phase and gain mismatch between two quadrature signals. Ideally, the quadrature signals should be at ninety degrees phase shift and have the same magnitude.

With reference to FIG. 1, a prior art complex receiver 100 is depicted that implements an analog in-phase/quadrature (I/Q) signal mismatch calibration circuit. As is illustrated, an input of a low noise amplifier (LNA) 110 receives a radio frequency (RE) input signal ($RF_{IN}$) and an output of the LNA 110 is coupled to a first input of a mixer 102 and a first input of a mixer 104. The mixer 102 receives, at a second input, an in-phase local oscillator (LO(I)) signal from a quadrature voltage controlled oscillator (VCO) 112. Similarly, the mixer 104 receives, at a second input, a quadrature local oscillator (LO(Q)) signal from the VCO 112. An output of the mixer 102 is coupled to an input of a variable gain amplifier (VGA) 106 and an output of the mixer 104 is coupled in an input of a VGA 108. Gain adjustment inputs of the VGAs 106 and 108 are coupled to an output of an analog I/Q gain correction circuit 118. An output of an RF-phase locked loop (RF-PLL) 114 is coupled to a reference input of the VCO 112.

The RF-PLL 114 provides a reference signal at the reference input of the VCO 112. The VCO 112 implements two different oscillators (not separately shown) that are coupled together by a differential transistor pair 120 that includes a current source 112, coupled between sources of the differential transistor pair 120 and ground. An I/Q phase correction circuit 116 is coupled to the inputs of the differential pair 120. The I/Q phase correction circuit 116 modifies a phase between in-phase (I) and quadrature (Q) signals by changing a ratio between tail currents that flow through the differential transistor pair 120.

Thus, the receiver 100 may correct for a phase shift between I and Q signals by performing an analog phase matching adjustment. Similarly, the I/Q gain correction circuit 118 adjusts, in an analog manner; a gain value of the quadrature signal paths by applying an appropriate analog signal to the gain inputs of the VGAs 106 and 108. Unfortunately, this technique has a relatively low accuracy due to the analog correction circuitry implemented within the gain correction and phase correction circuits 118 and 116, and, as such, the image rejection performance of the receiver 100 is limited. Moreover, as previously mentioned, an analog correction circuit is subject to process, temperature, and/or supply voltage variations, which requires repeating the calibration process when conditions change. Furthermore, an analog implementation is not particularly well suited for modern highly integrated receivers that utilize digital signal processors (DSPs) and which usually implement digital control signals.

While digital control of gain and phase correction for complex RF receivers has been employed, implementing digital control has required converting intermediate frequency in-phase (IF(I)) and quadrature (IF(Q)) signals to a digital format. In the terrestrial TV case, converting the IF(I) and IF(Q) signals to a digital format has required analog-to-digital converters (ADCs) with relatively large dynamic ranges. Integrating an ADC with a relatively large dynamic range requirement in general purpose complementary metal-oxide semiconductor (CMOS) technology is generally difficult.

Turning to FIG. 2, a prior art complex receiver 200 is depicted that implements a digital I/Q correction technique, which requires the quadrature IF signals be converted into a digital format. An input of a low noise amplifier (LNA) 202 receives an RF input signal ($RF_{IN}$) and an output of the LNA 202 is coupled to a first input of a mixer 204 and a first input of a mixer 206. An RF-PLL 210 provides a reference signal to a circuit 208, which provides an in-phase LO signal to a second input of the mixer 204 and a quadrature LO signal to a second input of the mixer 206. An output of the mixer 204 is coupled to an input of an anti-aliasing filter 212, whose output is coupled to an input of a variable gain amplifier (VGA) 216. An output of the VGA 216 is coupled to an input of an adaptive active filter (AAF) 220, which compensates for frequency dependent transmission path attenuation by boosting higher frequency components of a received signal. An output of the AAF 220 is coupled to an input of an analog-to-digital converter (ADC) 224, whose output is coupled to an input of an I/Q correction circuit 228, which performs I/Q correction on the in-phase (I) and quadrature (Q) signals.

Similarly, an output of the mixer 206 is coupled to an input of an anti-aliasing filter 214, whose output is coupled to an input of a VGA 218. An output of the VGA 218 is coupled to an input of the AAF 222, whose output is a coupled to an input of the ADC 226. An output of the ADC 226 is coupled to an input of the I/Q correction circuit 228, which, as previously noted, functions to correct a phase and gain difference between the I and Q signals. Outputs of the I/Q correction circuit 228 are coupled to inputs of a digital signal processor (DSP) 230, which performs digital mixing and channel selection. Thus, in order to perform I/Q correction the receiver 200 converts the quadrature IF signals to a digital format. While variations of the receiver 200 have been successfully implemented in communications systems, e.g., cellular telephony and satellite TV receivers, the relatively large ADC dynamic range requirement of the architecture is not particularly appropriate for general purpose CMOS integration.

What is needed is a technique for performing I/Q correction of a complex radio frequency receiver implemented in a terrestrial TV application that may be readily integrated within current CMOS processes.

SUMMARY

According to an embodiment of the present invention, a receiver includes a first mixing digital-to-analog converter (DAC), a second mixing DAC, a direct digital frequency synthesizer (DDFS), a phase correction circuit, a first selectable load and a magnitude correction circuit. The first mixing DAC includes a first input for receiving an input signal, a second input for receiving a digital first local oscillator (LO) signal and an output. The second mixing DAC includes a first input for receiving the input signal, a second input for receiving a digital second local oscillator (LO) signal and an output. The DDFS includes a first output coupled to the second input of the first mixing DAC, a second output coupled to the second input of the second mixing DAC and a control input. The DDFS is configured to provide the digital first and digital second LO signals, and which are quadrature signals. The phase correction circuit includes an output coupled to the control input of the DDFS and is configured to provide a phase correction signal to the control input of the DDFS, based on a phase control signal at an input of the phase correction circuit. The first selectable load includes an input coupled to the output of the first mixing DAC and a control input. The magnitude correction circuit includes a first output coupled to the control input of the first selectable load and is configured to provide a first magnitude correction signal to the control input of the first selectable load based on a magnitude control signal at an input of the magnitude correction circuit.

According to another embodiment of the present invention, a method for calibrating a receiver comprises setting a direct digital frequency synthesizer (DDFS) to output a digital local oscillator (LO) signal at a frequency that mixes a selected channel of an input signal to a predetermined frequency. A calibration tone is generated at an image frequency of the selected channel. The digital local oscillator signal is mixed with the calibration tone to provide a first output signal. A power level of the first output signal is determined and the receiver is calibrated by adjusting a characteristic of the DDFS in response to the power level.

According to still another embodiment of the present invention, a method for performing phase and magnitude calibration on a complex receiver comprises determining a phase difference between analog quadrature signals provided at respective outputs of quadrature mixing digital-to-analog converters (DACs). A magnitude difference between the quadrature signals is determined. A phase of at least one of a pair of quadrature local oscillator (LO) signals is adjusted based on a digital phase control signal, when the phase difference between the analog quadrature signals is indicated to be greater than a first value or less than a second value. A magnitude of at least one of the analog quadrature signals is adjusted based on a digital magnitude control signal, when the magnitude difference between the quadrature signals is indicated to be greater than a third value.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

According to embodiments of the present invention, harmonic distortion and local oscillator (LO) leakage issues, in a complex radio frequency (RF) receiver, are addressed by implementing a direct digital frequency synthesizer (DDFS) and mixing digital-to-analog (DAC) architecture. As used herein, a "radio frequency" signal means an electrical signal conveying useful information and having a frequency from about 3 kilohertz (kHz) to thousands of gigahertz (GHz), regardless of the medium through which such signal is conveyed. Thus, an RF signal may be transmitted through air, free space, coaxial cable, fiber optic cable, etc. According to various aspects of the present invention, hybrid gain and phase correction techniques are employed to improve an image rejection performance of a complex RF receiver. The techniques typically employ digital phase correction and analog gain correction using digital control signals. An open-loop technique is disclosed that reduces static phase and gain offsets in a complex RF receiver. Closed-loop techniques are disclosed that reduce dynamic phase and gain offsets in a complex RE receiver. While gain and phase correction techniques disclosed herein are particularly applicable to complex RE receivers implementing mixing DACs, it is contemplated that the techniques may be broadly applicable to other complex RF receivers.

Figure 1:
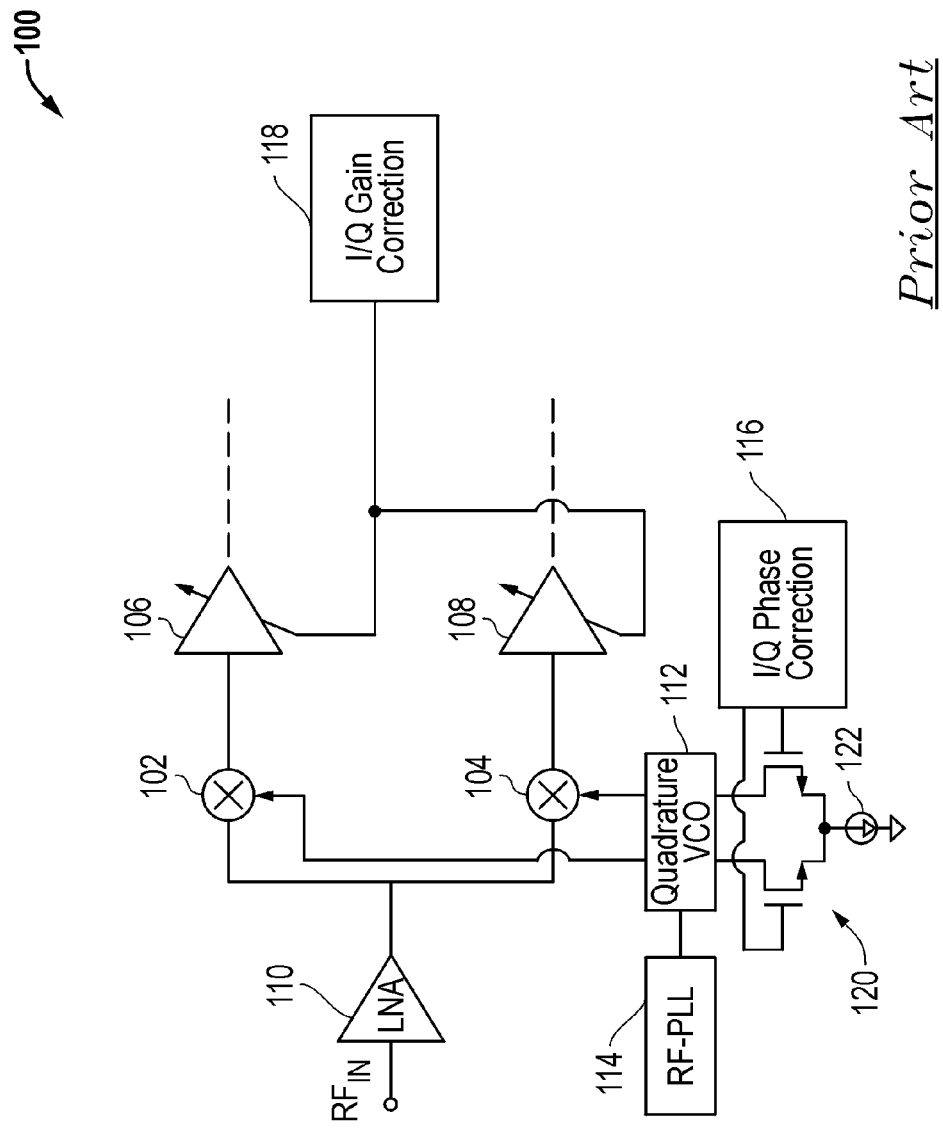
FIG. 1 is an electrical diagram, in block and schematic form, of a relevant portion of prior art complex radio frequency (RF) receiver that implements analog gain and phase correction.
Figure 2:
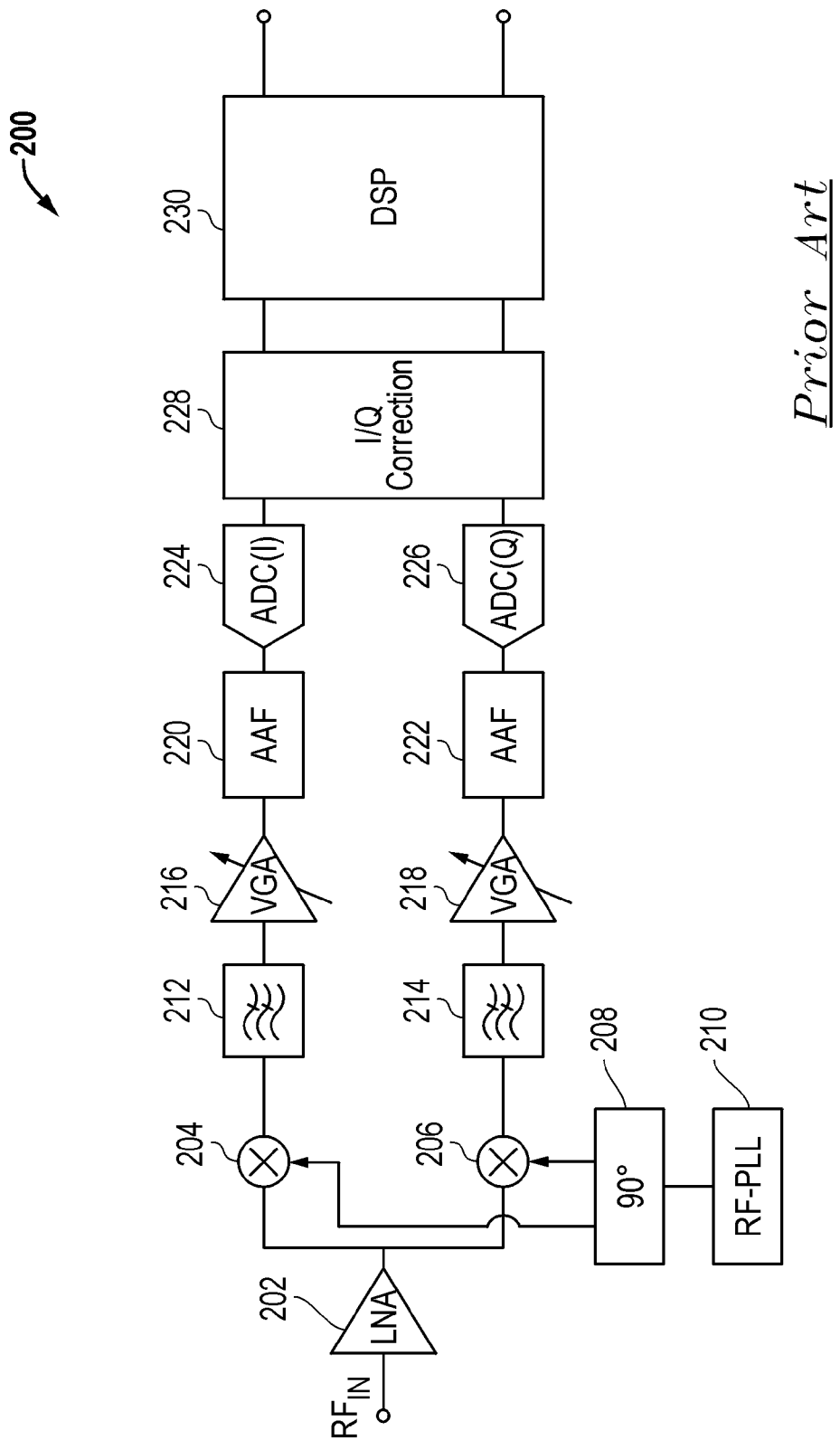
FIG. 2 is an electrical diagram, in block and schematic form, of a relevant portion of another prior art complex RF receiver that implements digital gain and phase correction.
Figure 3:
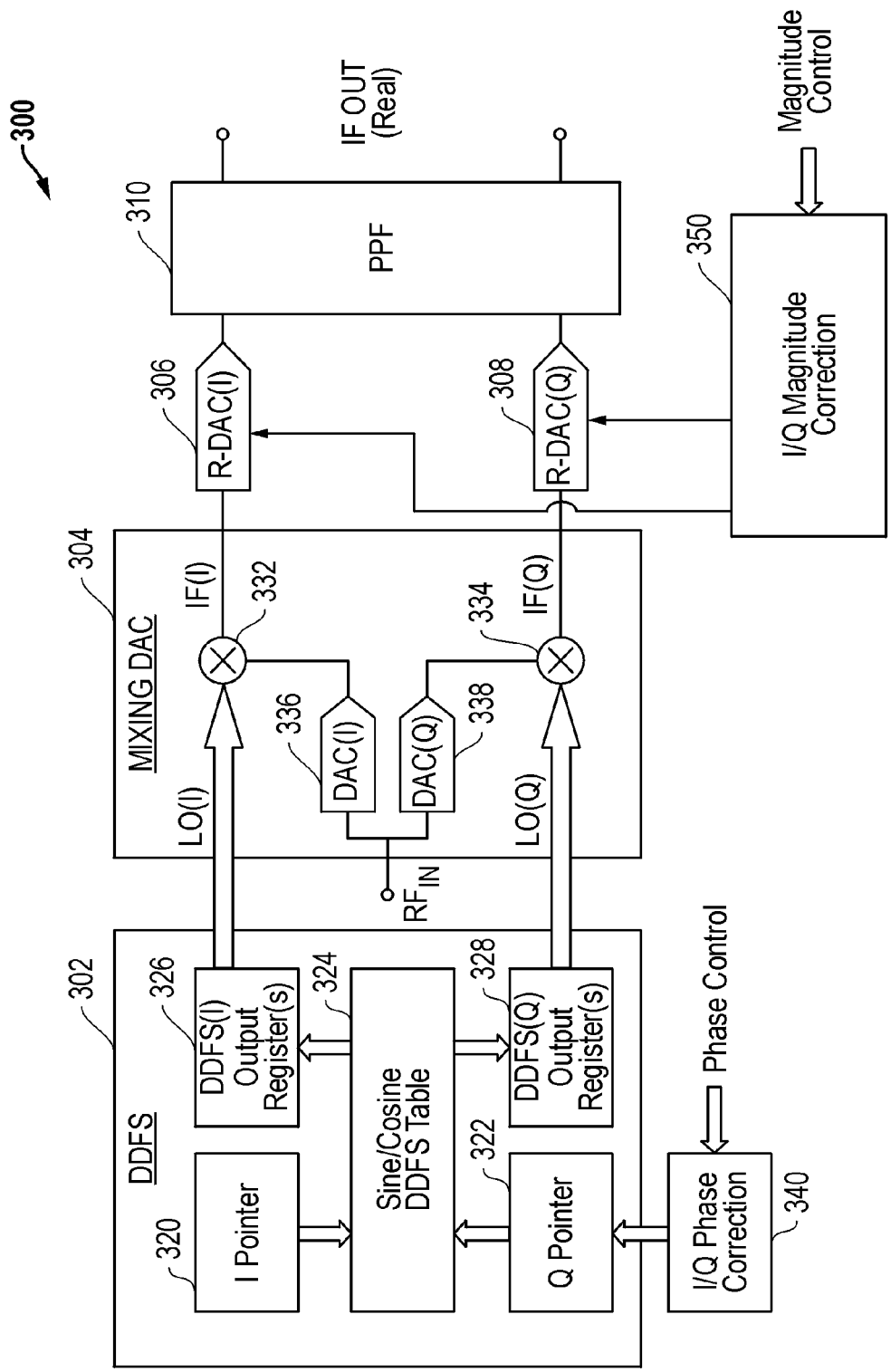
FIG. 3 is an electrical diagram, in block and schematic form, of a relevant portion of a complex RF receiver that implements open-lop gain and phase correction, according to an embodiment of the present invention.

Turning to FIG. 3, a receiver 300 is depicted that includes a DDFS 302, which provides a digital in-phase local oscillator LO(I) signal and a digital quadrature local oscillator LO(Q) signal to a mixing DAC 304. As is depicted, the DDFS 302 includes an in-phase (I) pointer 320 and a quadrature (Q) pointer 322. The I pointer 320 and the Q pointer 322 point to respective entries in a sine/cosine DDFS table 324. The LO(I) and LO(Q) signals are generated by the DDFS 302 using the table 324. The table 324 stores, for example, one quarter of a sinusoidal waveform and includes two pointer accumulators and registers (not separately shown), which store a current value of the index from the table 324 from which the DDFS 302 reads sine and cosine values. Using a DDFS approach leads to accurate phase matching between a digital LO(I) and LO(Q) signals. It should however, be appreciated, that the mixing DAC 304, which performs a down conversion of an RF input signal, using the digital quadrature LO signals, generally has finite gain and phase mismatches that limit an image rejection performance of the receiver 300.

As is shown, the mixing DAC 304 includes a switching section (mixer) 332, a DAC 336, a switching section (mixer) 334 and a DAC 338. The DACs 336 and 338 are part of RF transconductance sections that receive an RF input signal (REIN) and essentially convert the RF input signal from an fu voltage to an RF current. The RE current from the DAC 336 is provided to a second input of the mixer 332, which receives at a first input the LO(I) signal. Similarly, the RE current from the DAC 338 is provided to a second input of the mixer 334, which receives at a first input the LO(Q) signal. An output of the mixer 332 is coupled to an input of a resistive DAC (R-DAC (I)), whose output is coupled to an input of a polyphase filter (PPF) 310. Similarly, an output of the mixer 334 is coupled to an input of a resistive DAC (R-DAC (Q)), whose output is coupled to an input of the PPF 310. As is illustrated, an I/Q magnitude correction circuit 350 includes a first output that is coupled to a second input of the R-DAC (I) 306 and a second output that is coupled to a second input of the R-DAC 308.

The I/Q magnitude correction circuit 350 receives a digital magnitude control signal (e g., a magnitude control word), which dictates magnitude correction signals provided on the first and second outputs of the circuit 350. Alternatively, separate magnitude control signals may be received for each of the R-DACs 306 and 308. Similarly, an I/Q phase correction circuit 340 receives a phase control signal, which dictates a phase correction signal provided to the Q pointer 322 of the DDFS 302. While the circuit of FIG. 3 implements phase correction by adjusting the Q pointer 322, it is contemplated that either or both the I pointer 320 and the Q pointer 322 may be shifted to achieve a desired phase adjustment. The fact that the local oscillator I and Q signals are in the digital domain simplifies phase correction. That is, phase correction may be achieved by implementing a shift left or a shift right of a DDFS pointer that reads one or more of the quadrature signals from the table 324. As an accumulator of the DDFS typically has a very large length, typically 16 to 18 bits, a very high resolution phase adjustment may be achieved. For example, phase adjustments of 0.001 degrees can be realized with the receiver 300. Phase adjustments having a resolution of 0.001 degrees are compatible with image rejection levels in excess of 75 decibels (dBs).

As is shown, output currents from the mixers 332 and 334 are provided to resistive loads provided by the R-DACs 306 and 308. The R-DACs 306 and 308 provide, for example, an analog intermediate frequency (IF) output voltage that is processed by an IF signal path. While the magnitude correction is performed in the analog domain, by adjusting a value of the resistive loads, control is performed in a digital manner and, as such, the technique is particularly well suited for a mixed signal CMOS TV receiver (tuner) implementation.

Figure 4:
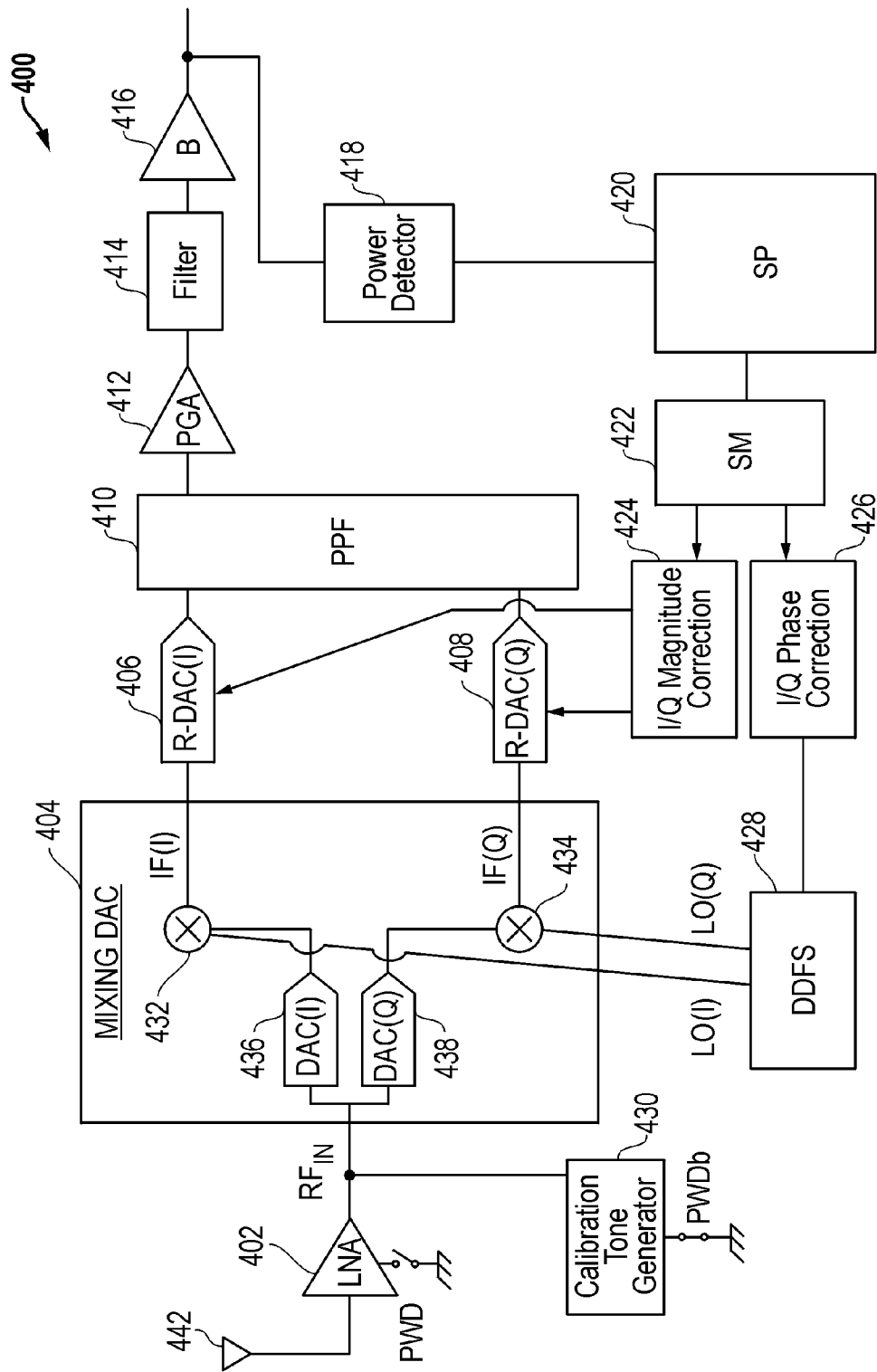
FIG. 4 is an electrical diagram, in block and schematic form, of a relevant portion of another complex RE receiver that implements closed-loop gain and phase correction, according to another embodiment of the present invention.

Referring to FIG. 4, a receiver 400 is depicted that implements a closed-loop hybrid analog/digital I/Q calibration technique. In a usual case, an ideal calibration circuit should preserve as much of the receiver structure as possible, so as to not introduce any new mismatches that can invalidate the calibration process. According to this aspect of the present invention, closed-loop I/Q calibration is achieved by injecting a test tone (at an image frequency of interest) into an RF signal path with a calibration tone generator 430. It should be appreciated that image rejection typically varies with frequency and, as such, it may be desirable to perform calibration at each TV channel change (or at least for a group of TV channels). Moreover it should also be appreciated that adding switches in series with the RF signal path is generally not desirable due to the noise penalty. In at least one embodiment of the closed-loop I/Q calibration technique disclosed herein, a low noise amplifier (LNA) 402 may be powered-down by opening switch PWD. This usually prevents a signal (e.g., an image channel) provided via antenna 442 from leaking into the receiver 400 during calibration. Similarly, switch PWDb is opened during normal operation of the receiver 400 to remove calibration tone generator 430 from the RF signal path.

It should also be appreciated that achieving an image rejection value in excess of 65 dB requires a relatively large input isolation of a front-end LNA, when the LNA is powered-down. As is shown, the receiver 400 includes the antenna 442 coupled to an input of the LNA 402, whose output is coupled to inputs of DACs 436 and 438 of mixing digital-to-analog (DAC) 404. An output of the DAC 436 is coupled to a first input of mixer 432. Similarly, an output of the DAC 438 is coupled to a first input of mixer 438. The DDFS 428 provides an in-phase local oscillator LO(I) signal to a second input of the mixer 432 and a quadrature local oscillator LO(Q) signal to a second input of the mixer 434. Similar to the embodiment of FIG. 3, an output of the mixer 432 is coupled to an input of a resistive-DAC (R-DAC(I)) 406 and an output of the mixer 434 is coupled to an input of an R-DAC(Q) 408. Outputs of the R-DACs 406 and 408 are coupled to inputs of a polyphase filter (PPF) 410. An output of the PPF 410 is coupled to an input of a programmable gain amplifier (PGA) 412, whose output is coupled to an input of a filter 414. An output of the filter 414 is coupled to an input of a buffer 416, whose output is coupled to an input of a power detector 418. The power detector 418 provides an indication of a power level at an image frequency, which power level is utilized in determining an appropriate gain and/or phase correction to implement for the receiver 400.

An output of the power detector 418 is coupled to an input of a signal processor 420, which may be an analog signal processor (ASP) or a digital signal processor (DSP). In at least one embodiment, the signal processor 420 performs filtering and analog-to-digital conversion (ADC) of the output signal provided by the power detector 418. An output of the SP 420 is coupled to an input of a state machine (SM) 422. The SP 420 provides an appropriate signal, based on the output signal provided by the power detector 418, to the SM 422 to cause the SM 422 to transition to (or remain in) an appropriate state. A first output of the state machine 422 is coupled to an input of an I/Q magnitude correction circuit 424 and a second output of the SM 422 is coupled to an input of I/Q phase correction circuit 426.

The SM 422 provides a digital phase control signal and a digital magnitude control signal to respective inputs of the I/Q magnitude correction circuit 424 and the I/Q phase correction circuit 426, based upon the state of the SM 422 (as dictated by the SP 420). A first output of the I/Q magnitude correction circuit 424 is coupled to a second input of the R-DAC 406 and a second output of the I/Q magnitude correction circuit 424 is coupled to a second input of the R-DAC 408. An output of the I/Q phase correction circuit 426 is coupled to an input of the DDFS 428. The DDFS 428 operates in a manner similar to that of the DDFS 302 and adjusts a phase of the in-phase and/or quadrature LO signals, based upon a phase correction signal provided by the I/Q phase correction circuit 426 to affect a phase correction of the IF(I) and IF(Q) signals. Similarly, the I/Q magnitude correction circuit 424 provides a magnitude correction signal to the second inputs of the R-DACs 406 and 408, responsive to the magnitude control signal, to affect a magnitude correction of the IF(I) and IF(Q) signals.

Figure 5:
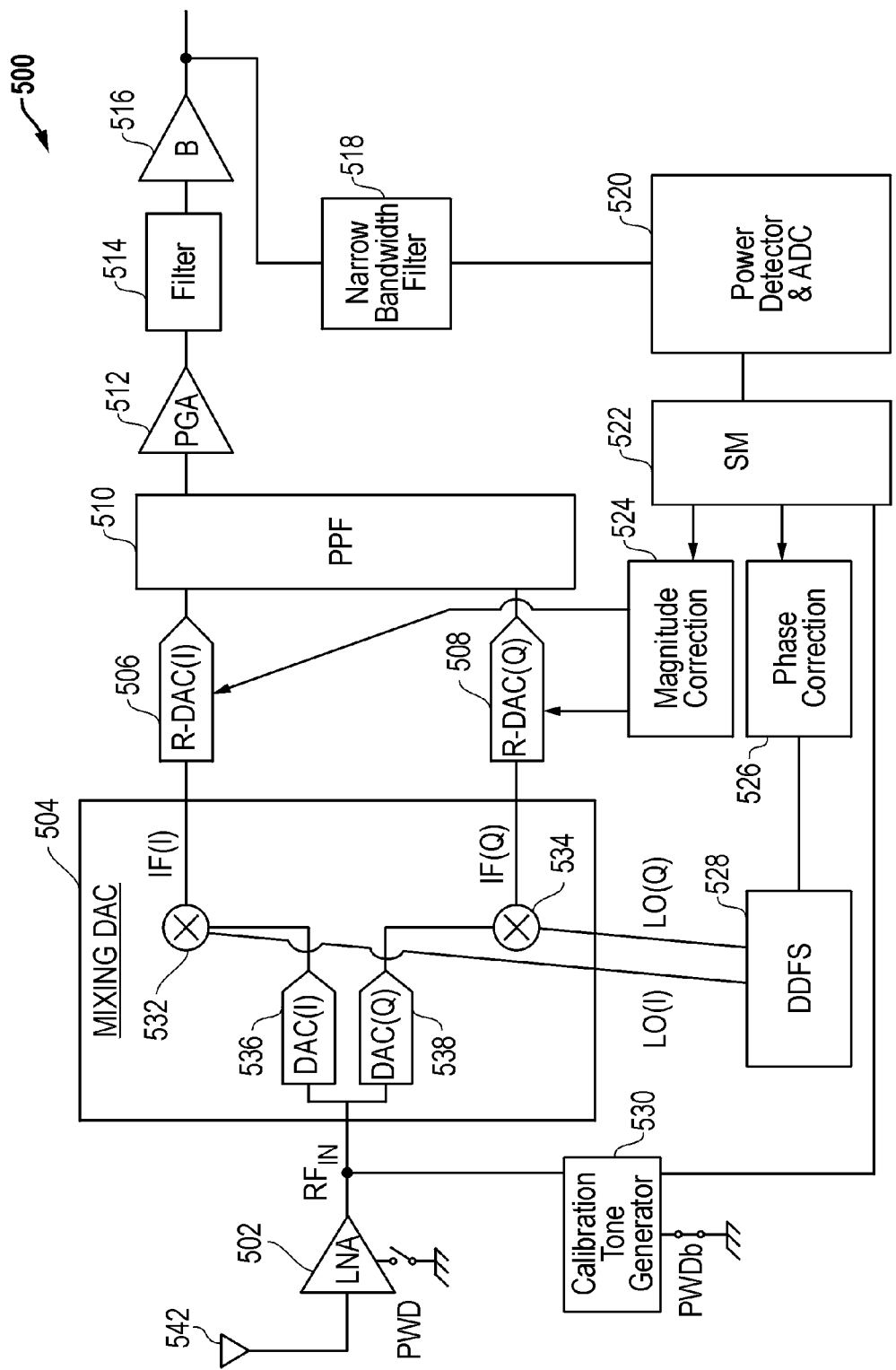
FIG. 5 is an electrical diagram, in block and schematic form, of a relevant portion of yet another complex RF receiver that implements closed-loop gain and phase correction, according to an embodiment of the present invention.

In some cases, powering down an LNA may not provide enough isolation to achieve a specified image rejection performance. Turning to FIG. 5, a receiver 500 is depicted that is designed to implement a sliding calibration tone, assuming that image channel leakage into the receiver 500 exceeds a desired value, when LNA 502 is powered-down. As is depicted, the receiver 500 includes a complex mixing DAC 504 which includes a mixer 532, a mixer 534, an in-phase DAC 536 and a quadrature DAC 538. The LNA 502 receives input from an antenna 542. An output of the LNA 502 is coupled to inputs of the DACs 536 and 538. An output of the DAC 536 is coupled to a first input of the mixer 532 and an output of the DAC 538 is coupled to a first input of the mixer 534. A DDFS 528 provides an in-phase local oscillator LO(I) signal to a second input of the mixer 532 and a quadrature LO(Q) signal to a second input of the mixer 534. An output of the mixer 532 is coupled to an input of an R-DAC(I) 506 and an output of the mixer 534 is coupled to an input of an R-DAC(Q) 508.

An output of the R-DAC(I) 506 is coupled to an input of a polyphase filter (PPF) 510 and an output of the R-DAC(Q) 508 is coupled to an input of the PPF 510. An output of the PPF 510 is coupled to an input of a PGA 512, whose output is coupled to an input of a filter 514. An output of the filter 514 is coupled to a buffer 516, whose output is coupled to an input of a narrow bandwidth (bandpass) filter 518. The bandpass filter 518 is implemented to determine whether an image channel is leaking through the LNA 502, when the LNA 502 is powered-down by opening switch PWD. As used herein, the term "coupled" includes both a direct electrical connection between elements and an indirect electrical connection provided by intervening elements. For example, the filter 518 is coupled to the outputs of the R-DACs 506 and 508 indirectly through the PPF 510, the PGA 512, the filter 514 and the buffer 516. The bandpass filter 518 may be adjustable and may have, for example, a passband centered at an intermediate frequency (IF). It should be appreciated that the blocking profile in a broadcast TV application is fairly tonal with large narrow frequency blockers. According to one or more embodiments of the present invention, the receiver 500, when entering a calibration loop, first measures a power level at an image frequency without applying an image signal with the calibration tone generator 530.

If the power level is larger than a given target value, then state machine 522 determines that the leakage from antenna 542, through the LNA 502, is too large and provides a control signal to the generator 530 to slightly adjust (e.g., by a few hundred kHz) the tone frequency of the generator 530 so that the frequency does not coincide with the large blocking channel that is leaking through the LNA 502. Implementing a sliding calibration technique with narrow bandwidth power detection relaxes the leakage requirements on a front-end LNA, which readily allows for image rejection in excess of 65 dB after calibration. Moreover, implementing a DDFS based LO with digital controls, for both phase and magnitude adjustment, facilitates relatively low calibration times, (e.g., tens of milliseconds), which allows I/Q calibration to be performed at each channel change without adding a noticeable delay in the switching process.

With reference again to FIG. 5, an output of the bandpass filter 518 is coupled to an input of a power detector and analog-to-digital converter (ADC) circuit 520, which determines the amount of power at the frequencies passed by the filter 518 and provides a digital signal to an input of the state machine (SM) 522. The SM 522, based on the digital signal, transitions (or remains) in a particular state which determines a digital phase control signal to provide to an input of the phase correction circuit 526 and a digital magnitude control signal to provide to an input of the magnitude correction circuit 524. Based upon the control signal received at the input of the magnitude correction circuit 524, the magnitude correction circuit 524 provides appropriate signals to second inputs of the resistive DACs 506 and 508. Similarly, the phase correction circuit 526 provides a phase correction signal to an input of the DDFS 528, based upon the phase control signal.

Figure 6:
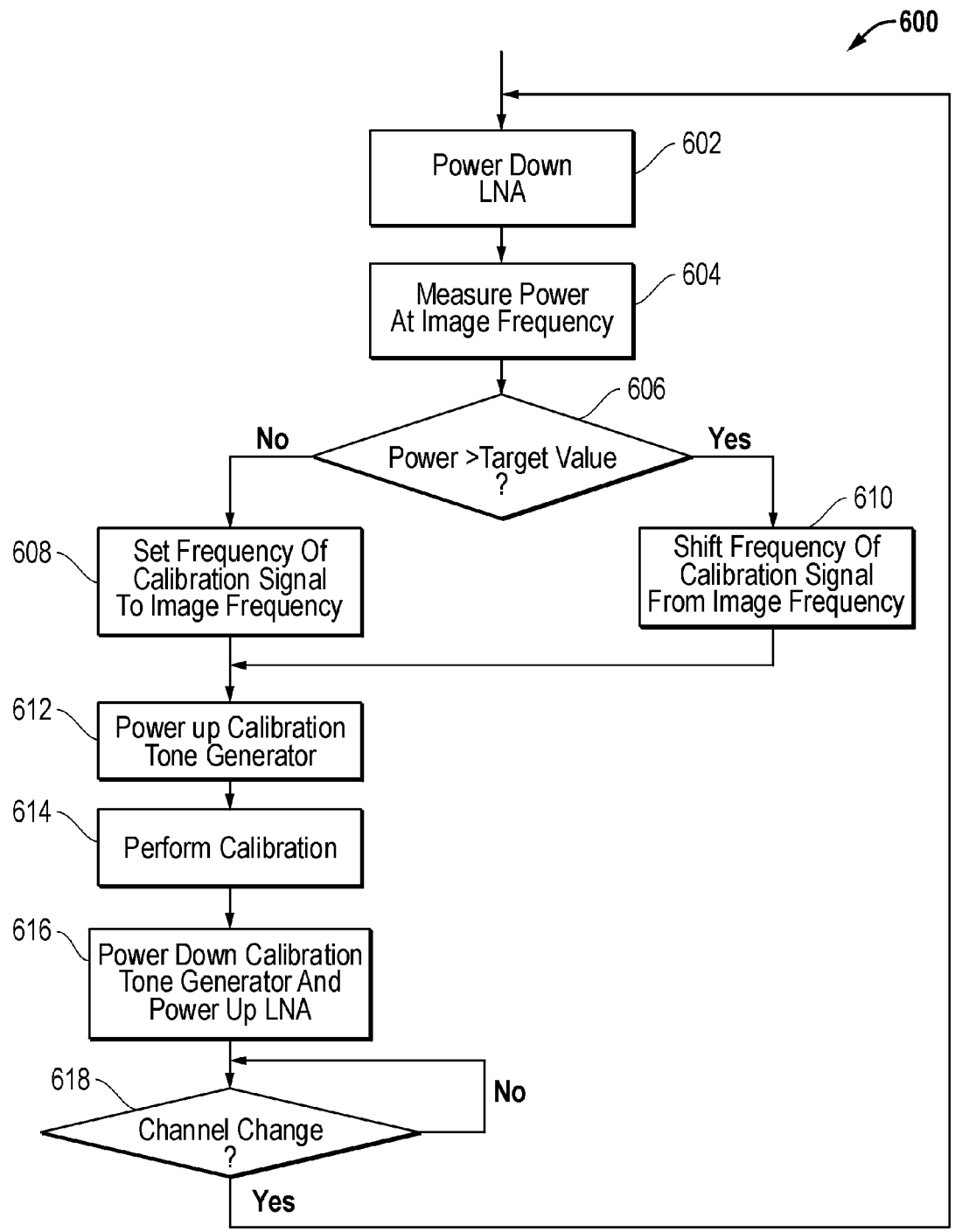
FIG. 6 is a flowchart of an exemplary process for calibrating a complex RF receiver, according to an embodiment of the present invention.

Moving to FIG. 6, an exemplar calibration process 600, which implements a sliding calibration technique for a complex RF receiver, is depicted. In block 602, a low-noise amplifier (LNA) is powered-down. Next, in block 604, power at an image frequency of interest is measured. Then, in decision block 606, it is determined whether the measured power at the image frequency is above a target value. If so, control transfers to block 610 where a frequency of a calibration frequency is shifted from an image frequency of interest to avoid a large blocking channel (i.e., an image channel) that is leaking through a front-end LNA of the receiver. Otherwise, control transfers to block 608 where the calibration frequency is set to the image frequency of interest. From blocks 608 and 610, control transfers to block 612 where a calibration tone generator is powered-up. Next, in block 614, calibration is performed by determining a phase and magnitude difference of, for example, IF(I) and IF(Q) signals and appropriate control signals in response thereto. It should be appreciated that the technique is also generally applicable to complex receivers that convert directly to baseband signals. Then, in block 616, the calibration tone generator is powered-down and the LNA is powered-up. Finally, control loops on decision block 618 until a channel change of interest is detected. When a channel change of interest is detected, control transfers from block 618 to block 602.

Figure 7:
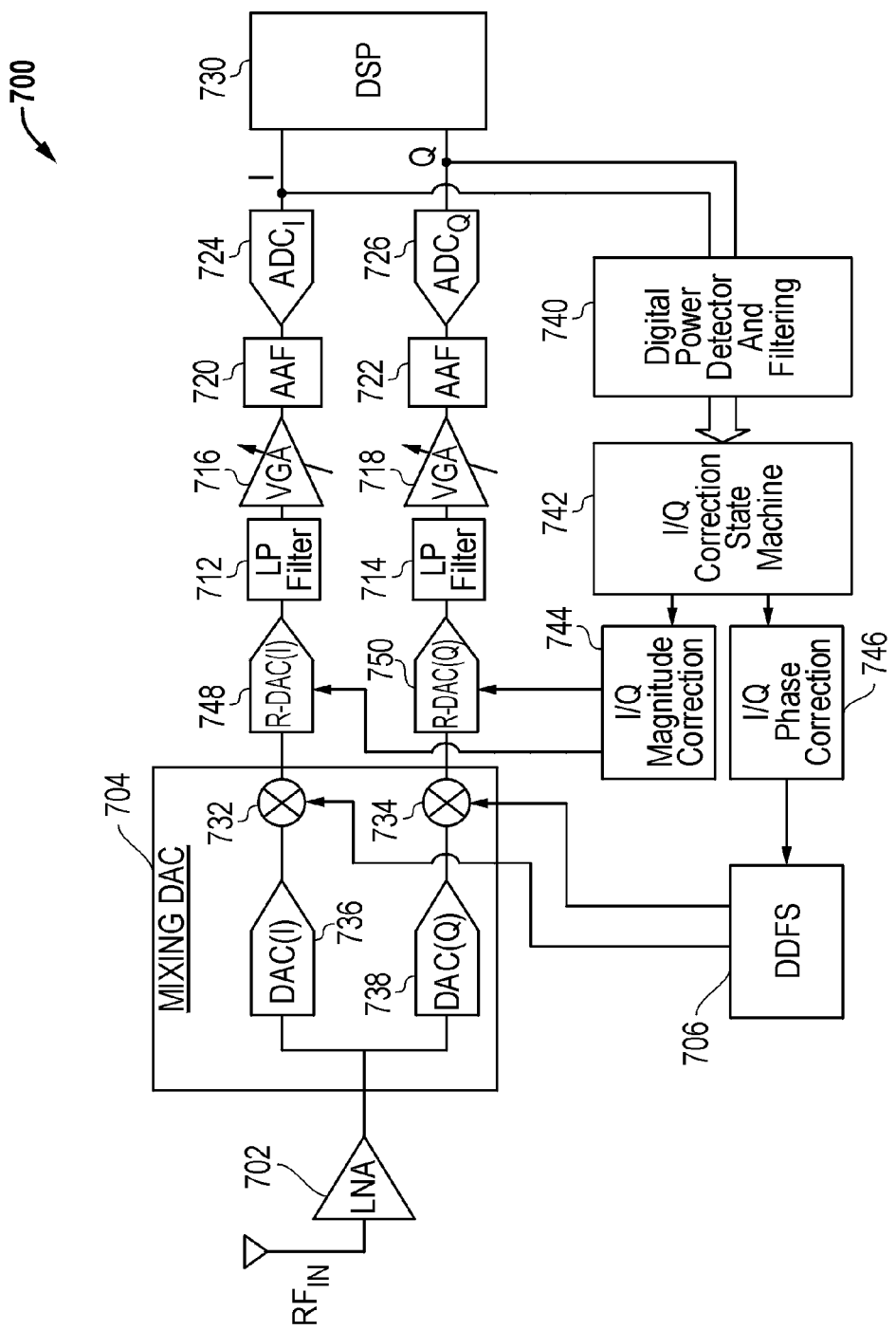
FIG. 7 is a is an electrical diagram, in block and schematic form, of a relevant portion of a complex RF receiver that implements digital gain and phase correction, according to another embodiment of the present invention.

Turning to FIG. 7, a complex receiver 700 is depicted that implements a digital I/Q correction technique, according to one or more embodiments of the present invention. An input of a low-noise amplifier (LNA) 702 receives an RF input signal (RFIN) and an output of the LNA 702 is coupled to an input of an in-phase digital-to-analog converter (DAC(I)) 736 of mixing DAC 704 and an input of a quadrature DAC (DAC(Q)) 738 of the mixing DAC 704. An output of the DAC(I) 736 is coupled to a first input of an in-phase switching section (mixer) 732 and an output of the DAC(Q) 736 is coupled to a first input of a quadrature switching section (mixer) 734. A direct digital frequency synthesizer (DDFS) 706 provides a digital in-phase local oscillator (LO) signal to a second input of the mixer 732 and a digital quadrature LO signal to a second input of the mixer 734. An output of the mixer 732 is coupled to an input of a resistive DAC (R-DAC(I)) 748, whose output is coupled to an input of an anti-aliasing filter 712. An output of the filter 712 is coupled to an input of a variable gain amplifier (VGA) 716. An output of the VGA 716 is coupled to an input of an adaptive active filter (AAF) 720, which compensates for frequency dependant transmission path attenuation by boosting higher frequency components of a received signal. An output of the AAF 720 is coupled to an input of an analog-to-digital converter (ADC(I)) 724, whose output is coupled to an in-phase (I) input of a digital signal processor (DSP) 730 and a first input of a digital power detector 740, which performs power detection and filtering.

Similarly, an output of the mixer 734 is coupled to an input of a resistive DAC (R-DAC(Q)), whose output is coupled to an input of an anti-aliasing filter 714, whose output is coupled to an input of a VGA 718. An output of the VGA 718 is coupled to an input of AAF 722, whose output is coupled to an input of ADC(Q) 726. An output of the ADC(Q) 726 is coupled to a quadrature (Q) input of the DSP 730 and a second input of the detector 740. The DSP 730 performs digital mixing and channel selection on the I and Q signals. An output of the power detector 740 is coupled to an input of a I/Q correction state machine (SM) 742. The detector 740 provides an appropriate signal to the SM 742 which causes the SM 742 to transition to (or remain in) an appropriate state. A first output of the SM 742 is coupled to an input of an I/Q magnitude correction circuit 744 and a second output of the SM 742 is coupled to an input of I/Q phase correction circuit 746.

The SM 742 provides a digital magnitude control signal and a digital phase control signal to respective inputs of the I/Q magnitude correction circuit 744 and the I/Q phase correction circuit 746, based upon the state of the SM 742. A first output of the I/Q magnitude correction circuit 742 is coupled to a second input of the R-DAC(I) 748 and a second output of the I/Q magnitude correction circuit 744 is coupled to a second input of the R-DAC(Q) 750. An output of the I/Q phase correction circuit 746 is coupled to an input of the DDFS 706. The DDFS 706 operates in a manner similar to that of the DDFS 302 and adjusts a phase of the in-phase and/or quadrature LO signals, based upon a phase correction signal provided by the I/Q phase correction circuit 746 to affect a phase correction of the I and/or Q signals. Similarly, the I/Q magnitude correction circuit 744 provides a magnitude correction signal to the second inputs of the R-DACs 748 and 750, responsive to the magnitude control signal, to affect a magnitude correction of the I and Q signals.

Accordingly, a number of techniques have been disclosed herein that readily facilitate I/Q correction of quadrature signals of a complex receiver in CMOS processes.

The above-disclosed subject matter is to be considered illustrative, and not restrictive, and the appended claims are intended to cover all such modifications, enhancements, and other embodiments that fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A receiver, comprising:
   a first mixing digital-to-analog converter (DAC) including a first input for receiving an input signal, a second input for receiving a digital first local oscillator (LO) signal and an output;
   a second mixing DAC including a first input for receiving the input signal, a second input for receiving a digital second local oscillator (LO) signal and an output;
   a direct digital frequency synthesizer (DDFS) including a first output coupled to the second input of the first mixing DAC, a second output coupled to the second input of the second mixing DAC and a control input, wherein the DDFS is configured to provide the digital first and digital second LO signals, and wherein the digital first and digital second LO signals are quadrature signals;
   a phase correction circuit including an output coupled to the control input of the DDFS, wherein the phase correction circuit is configured to provide a phase correction signal to the control input of the DDFS based on a phase control signal at an input of the phase correction circuit;
   a first selectable load including an input coupled to the output of the first mixing DAC and a control input; and
   a magnitude correction circuit including a first output coupled to the control input of the first selectable load, wherein the magnitude correction circuit is configured to provide a first magnitude correction signal to the control input of the first selectable load based on a magnitude control signal at an input of the magnitude correction circuit.

2. The receiver of claim 1, wherein the phase and first magnitude control signals are digital signals.

3. The receiver of claim 1, further comprising:
   a low-noise amplifier (LNA) having an input and an output coupled to the first inputs of the first and second mixing DACs, wherein the LNA is configured to be powered-down during calibration of the receiver.

4. The receiver of claim 1, further comprising:
   a second selectable load including an input coupled to the output of the second mixing DAC and a control input, wherein the magnitude correction circuit also includes a second output coupled to the control input of the second selectable load, wherein the magnitude correction circuit is further configured to provide a second magnitude correction signal to the control input of the second selectable load.

5. The receiver of claim 4, wherein the first and second selectable loads are resistive digital-to-analog converters (DACs).

6. The receiver of claim 4, further comprising:
   a calibration tone generator including an output coupled to the first inputs of the first and second mixing DACs, wherein the calibration tone generator is configured to selectively provide the input signal at a selected frequency;
   a power detector including an input coupled to outputs of the first and second selectable loads;
   a signal processor including an input coupled to an output of the power detector; and
   a state machine (SM) including an input coupled to an output of the signal processor, a first output coupled to the input of the magnitude correction circuit and a second output coupled to the input of the phase correction circuit, wherein the SM is configured to provide the phase control signal and the first and second magnitude control signals based on a power level detected by the power detector at the selected frequency.

7. The receiver of claim 6, further comprising:
   a filter coupled between the outputs of the first and second selectable loads and the input of the power detector.

8. The receiver of claim 7, wherein the filter is a bandpass filter centered at the selected frequency.

9. A method for calibrating a receiver, comprising:
   setting a direct digital frequency synthesizer (DDFS) to output a digital local oscillator (LO) signal at a frequency that mixes a selected channel of an input signal to a predetermined frequency;
   generating a calibration tone at an image frequency of the selected channel;

mixing the digital local oscillator signal with the calibration tone to provide a first output signal;
determining a power level of the first output signal; and
calibrating the receiver by adjusting a characteristic of the DDFS in response to the power level.

10. The method of claim 9, wherein the setting comprises setting the DDFS to output an in-phase digital LO signal and a quadrature digital LO signal as the digital LO signal.

11. The method of claim 10, wherein the adjusting comprises adjusting a phase difference between the in-phase digital LO signal and the quadrature digital LO signal.

12. The method of claim 11, wherein the adjusting further comprises changing a pointer to a lookup table that stores samples of a sinusoidal waveform.

13. The method of claim 9, further comprising:
adjusting a magnitude of the first output signal.

14. The method of claim 13, wherein first output signal includes an in-phase output signal and a quadrature output signal, and wherein the adjusting the magnitude of the output signal comprises adjusting a magnitude of at least one of the in-phase output signal and the quadrature output signal.

15. The method of claim 14, further comprising:
combining the in-phase output signal and the quadrature output signal to form the first output signal.

16. A method for performing phase and magnitude calibration on a complex receiver, comprising;
determining a phase difference between analog quadrature signals provided at respective outputs of quadrature mixing digital-to-analog converters (DACs);
determining a magnitude difference between the analog quadrature signals;
adjusting a phase of at least one of a pair of quadrature local oscillator (LO) signals based on a digital phase control signal, when the phase difference between the analog quadrature signals is indicated to be greater than a first value or less than a second value; and
adjusting a magnitude of at least one of the analog quadrature signals based on a digital magnitude control signal, when the magnitude difference between the quadrature signals is indicated to be greater than a third value.

17. The method of claim 16, further comprising:
combining the analog quadrature signals to provide an analog output signal; and
determining a power level of the analog output signal at a selected LO frequency, wherein the determined phase and magnitude differences are based on the power level of the analog output signal.

18. The method of claim 16, further comprising:
combining the analog quadrature signals to provide an analog output signal;
determining a power level of the analog output signal at a selected LO frequency, prior to applying a calibration signal to an input of the mixing DACs;
providing the calibration signal to the input of the mixing DACs at a selected frequency, when a power level of the analog output signal is below a threshold; and
providing the calibration signal to the input of the mixing DACs at a frequency different from the selected frequency, when the power level is above the threshold, wherein the determined phase and magnitude differences are based on the power level of the analog output signal.

19. The method of claim 16, wherein the adjusting the magnitude is performed in an analog manner based on the digital magnitude control signal.

20. The method of claim 16, wherein the magnitude of at least one of the analog quadrature signals is adjusted by changing a value of a respective resistive-DAC associated with one of the quadrature signals.

* * * * *